(12) United States Patent
Sim et al.

(10) Patent No.: US 10,700,246 B2
(45) Date of Patent: Jun. 30, 2020

(54) SEMICONDUCTOR LIGHT EMITTING DEVICE

(71) Applicant: SAMSUNG ELECTRONICS CO., LTD., Suwon-si (KR)

(72) Inventors: Sung Hyun Sim, Uiwang-si (KR); Yong Il Kim, Seoul (KR); Ha Nul Yoo, Bucheon-si (KR); Ji Hye Yeon, Suwon-si (KR); Jun Bu Youn, Suwon-si (KR); Ji Hoon Yun, Suwon-si (KR); Su Hyun Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/299,422

(22) Filed: Mar. 12, 2019

(65) Prior Publication Data
US 2020/0105980 A1  Apr. 2, 2020

(30) Foreign Application Priority Data
Oct. 2, 2018 (KR) .......................... 10-2018-0117577

(51) Int. Cl.
*H01L 33/54* (2010.01)
*H01L 33/50* (2010.01)
*H01L 33/60* (2010.01)
*H01L 33/62* (2010.01)

(52) U.S. Cl.
CPC ............ *H01L 33/504* (2013.01); *H01L 33/54* (2013.01); *H01L 33/60* (2013.01); *H01L 33/62* (2013.01)

(58) Field of Classification Search
CPC ....... H01L 33/504; H01L 33/54; H01L 33/60; H01L 33/62
USPC .......................................................... 257/89
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |

(Continued)

*Primary Examiner* — Tu-Tu V Ho
(74) *Attorney, Agent, or Firm* — Sughrue Mion, PLLC

(57) ABSTRACT

A semiconductor light emitting device includes a plurality of light emitting structures, an isolation layer covering side surfaces of the plurality of light emitting structures and insulating the plurality of light emitting structures from one another, a partition layer formed on the isolation layer, a first protective layer covering top surfaces of the plurality of light emitting structures and side walls of the partition layer, a reflective layer covering the first protective layer and disposed on the side walls of the partition layer, and a second protective layer covering the reflective layer.

20 Claims, 16 Drawing Sheets

(56) References Cited

U.S. PATENT DOCUMENTS

| | | |
|---|---|---|
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,666,765 B2 | 5/2017 | Choi |
| 9,837,389 B2 | 12/2017 | Choi |
| 9,905,543 B2 | 2/2018 | Yeon et al. |
| 10,199,606 B2 * | 2/2019 | Teramoto ............ H01L 27/3211 |
| 2017/0200765 A1 | 7/2017 | Choi et al. |
| 2018/0151543 A1 | 5/2018 | Lee |
| 2018/0166424 A1 | 6/2018 | Sim et al. |

\* cited by examiner

SEMICONDUCTOR LIGHT EMITTING DEVICE

CROSS-REFERENCE TO THE RELATED APPLICATION

This application claims priority from Korean Patent Application No. 10-2018-0117577 filed on Oct. 2, 2018 in the Korean Intellectual Property Office, the disclosure of which is incorporated herein by reference in its entirety.

BACKGROUND

1. Field

The inventive concept relates to a semiconductor light emitting device, and more particularly, a semiconductor light emitting device capable of implementing multicolor.

2. Description of Related Art

A semiconductor light emitting device may have an extended lifespan, lower power consumption, and improved response speeds, while being eco-friendly, compared to a general light source device. A semiconductor light emitting device is an important light source device in various types of electronic products such as lighting devices, display devices, and the like.

A related art display device is configured to have a display panel including a liquid crystal display (LCD), and a backlight including a semiconductor light emitting device. Recently, semiconductor light emitting devices in a display device have been used as individual pixels such that it may not be necessary to provide a backlight in a display device. Such a display device may be compact in size and may implement higher brightness with a higher luminous efficiency as compared to a related art LCD. Further, an aspect ratio of a display screen may be variously adjusted such that diverse forms of large displays may be implemented.

SUMMARY

Example embodiment of the inventive concept provide a semiconductor light emitting device having a plurality of light emitting cells driven individually, implementing multicolor, preventing optical interference between the plurality of light emitting cells, and having improved light extraction efficiency.

According to an example embodiment, there is provided a semiconductor light emitting device which may include: a plurality of light emitting structures spaced apart from one another; an isolation layer covering side surfaces of the plurality of light emitting structures and insulating the plurality of light emitting structures from one another; a partition layer formed on the isolation layer; a first protective layer covering top surfaces of the plurality of light emitting structures and side walls of the partition layer; a reflective layer covering the first protective layer and disposed on the side walls of the partition layer; and a second protective layer covering the reflective layer.

According to an example embodiment, there is provided a semiconductor light emitting device which may include: a plurality of light emitting structures spaced apart from one another; an isolation layer insulating the plurality of light emitting structures from one another; a partition layer formed on the isolation layer and providing a plurality of light emitting windows respectively corresponding to the plurality of light emitting structures; and a three-layer reflective structure covering side walls of the partition layer.

According to an example embodiment, there is provided a semiconductor light emitting device which may include: a plurality of light emitting structures; a plurality of wavelength converting layers disposed on the plurality of light emitting structures; a partition layer encapsulating the plurality of wavelength converting layers and isolating the plurality of wavelength converting layers from one another; and a reflective structure disposed between the plurality of wavelength converting layers and the partition layer, and comprising a first insulating layer, a reflective layer, and a second insulating layer layered therein.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

Hereinafter, example embodiments of the inventive concept will be described with reference to the accompanying drawings.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items. Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
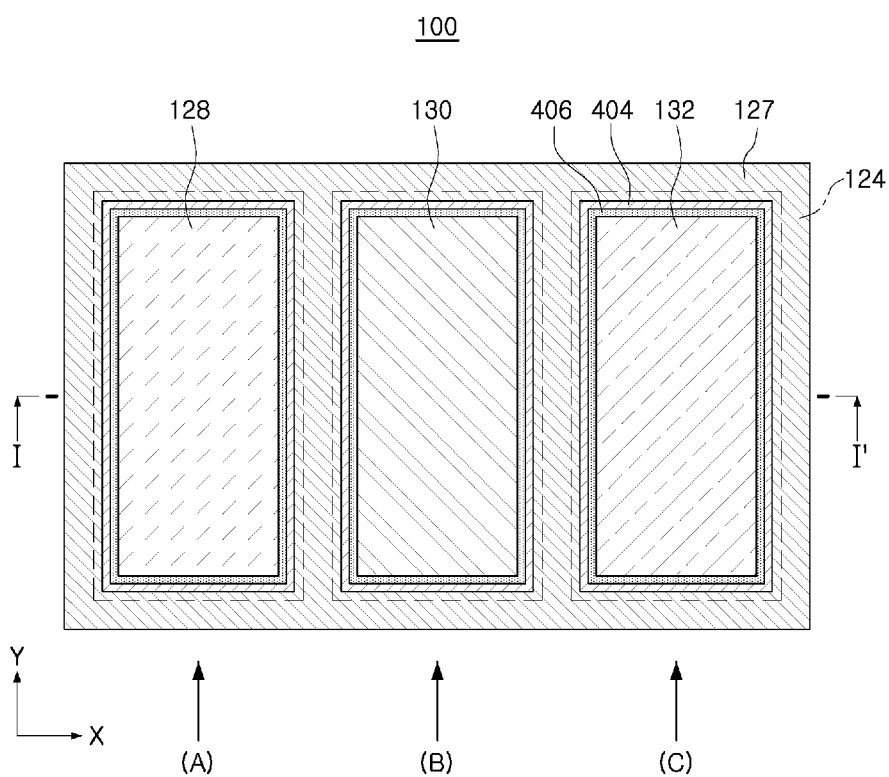
FIG. 1 is a schematic plan diagram illustrating a semiconductor light emitting device according to an example embodiment.
Figure 2:
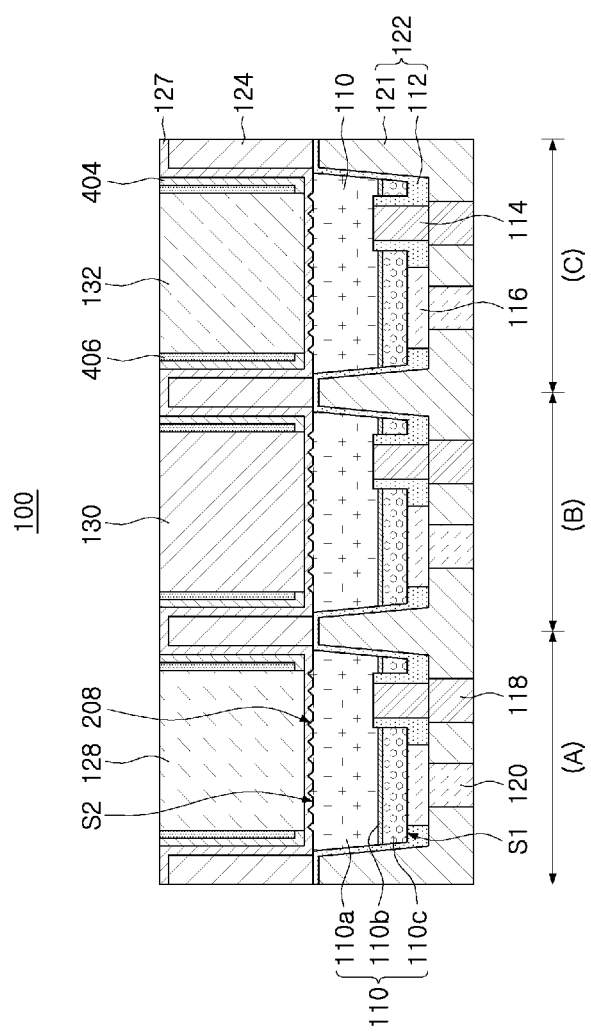
FIG. 2 is a schematic cross-sectional diagram taken along line I-I' in FIG. 1.

FIG. 1 is a schematic plan diagram illustrating a semiconductor light emitting device according to an example embodiment. FIG. 2 is a schematic cross-sectional diagram taken along line I-I' in FIG. 1.

Referring to FIGS. 1 and 2, a semiconductor light emitting device 100 may include a plurality of light emitting cells A, B, and C, which are a first light emitting cell A, a second light emitting cell B, and a third light emitting cell C, for example. The first to third light emitting cells A, B, and C may be isolated from one another by a partition layer 124 extending in an X direction and a Y direction. The partition layer 124 may encapsulate a plurality of wavelength converting layers 128, 130, and 132.

The semiconductor light emitting device 100 may include light emitting structures 110 provided in each of the first to third light emitting cells A, B, and C. The light emitting structures 110 may be spaced apart from one another in one direction, in the X direction in FIG. 1, for example. The first to third light emitting cells A, B, and C may include the light emitting structures 110 emitting lights having ultraviolet wavelengths or blue wavelengths.

The light emitting structure 110 may include a first conductivity-type semiconductor layer 110a, an active layer 110b, and a second conductivity-type semiconductor layer 110c. The first conductivity-type semiconductor layer 110a may be an N-type semiconductor layer. The second conductivity-type semiconductor layer 110c may be a P-type semiconductor layer. The first conductivity-type semiconductor layer 110a and the second conductivity-type semiconductor layer 110c may be formed of a material including a nitride semiconductor having composition of $Al_xIn_yGa_{1-x-y}N$ ($0 \leq x \leq 1$, $0 \leq y \leq 1$, $0 \leq x+y < 1$).

Each of the first conductivity-type semiconductor layer 110a and the second conductivity-type semiconductor layer 110c may be formed of a single layer, but may include a plurality of layers having different doping concentrations, different compositions, and the like. Each of the first conductivity-type semiconductor layer 110a and the second conductivity-type semiconductor layer 110c may use an AlInGaP type semiconductor or an AlInGaAs type semiconductor rather than the nitride semiconductor.

The active layer 110b disposed between the first conductivity-type semiconductor layer 110a and the second conductivity-type semiconductor layer 110c may emit a light having a predetermined level of energy, generated by recombination of electrons and holes. The active layer 110b may have a multi-quantum well (MQW) structure in which a quantum well layer and a quantum barrier layer are alternately layered. For example, when a nitride semiconductor is used, the active layer 110b may have a structure in which an InGaN layer and a GaN layer are alternately layered. The active layer 110b may have a single quantum well (SQW) structure using a nitride semiconductor. The active layer 110b may emit a light having an ultraviolet wavelength or a blue wavelength, for example, by changing a type or a composition of the material forming the active layer 110b.

Each of the light emitting structures 110 may have reflective electrode layers 114, 116 and pad electrode layers 118, 120 on one surfaces S1 thereof. The reflective electrode layers 114 and 116 and the pad electrode layers 118 and 120 may be formed on surfaces below the light emitting structures 110 as illustrated in FIG. 2. Accordingly, the semiconductor light emitting device 100 may have a flip-chip structure to be mounted on a board substrate (not illustrated).

The first reflective electrode layer 114 and the second reflective electrode layer 116 may be formed on the one surface S1 of the light emitting structure 110. The first reflective electrode layer 114 may be electrically connected to the first conductivity-type semiconductor layer 110a, and the second reflective electrode layer 116 may be electrically connected to the second conductivity-type semiconductor layer 110c. The first reflective electrode layer 114 and the second reflective electrode layer 116 may reflect a light emitted from the light emitting structure 110. The first reflective electrode layer 114 and the second reflective electrode layer 116 may be formed of a material having a high reflectivity such as a metal, for example. Each of the first reflective electrode layer 114 and the second reflective electrode layer 116 may be formed of aluminum (Al), gold (Au), silver (Ag), platinum (Pt), nickel (Ni), chromium (Cr), titanium (Ti), or copper (Cu).

The first pad electrode layer 118 and the second pad electrode layer 120 may be formed below the first reflective electrode layer 114 and the second reflective electrode layer 116, respectively. The first pad electrode layer 118 may be electrically connected to the first reflective electrode layer 114. The second pad electrode layer 120 may be electrically connected to the second reflective electrode layer 116. The first pad electrode layer 118 may be electrically connected to the first conductivity-type semiconductor layer 110a through the first reflective electrode layer 114, and the second pad electrode layer 120 may be electrically connected to the second conductivity-type semiconductor layer 110c through the second reflective electrode layer 116.

Each of the first pad electrode layer 118 and the second pad electrode layer 120 may be formed of a metal, for example. The first pad electrode layer 118 and the second pad electrode layer 120 may be formed of aluminum (Al), gold (Au), silver (Ag), platinum (Pt), nickel (Ni), chromium (Cr), titanium (Ti), or copper (Cu).

The semiconductor light emitting device 100 may include an isolation layer 122 electrically insulating the light emitting structures 110 from one another, electrically insulating the first reflective electrode layer 114 and the second reflective electrode layer 116 from each other, and electrically insulating the first pad electrode layer 118 and the second pad electrode layer 120 from each other.

The isolation layer 122 may extend from the one surface S1 to the other surface S2 of the light emitting structure 110. The light emitting structures 110 may be electrically isolated from one another and driven individually by means of the isolation layer 122. In other words, the light emitting structures 110, which are the first to third light emitting cells A, B, and C, for example, may be individually driven by means of the isolation layer 122. The one surface S1 of the light emitting structure 110 may be referred to as a bottom surface of the light emitting structure 110, and the other surface S2 of the light emitting structure 110 may be referred to as a top surface of the light emitting structure 110.

The isolation layer 122 may include an isolation insulating layer 112 disposed on side surfaces and bottom surfaces of the light emitting structures 110, and electrically insulating the first reflective electrode layer 114 and the second reflective electrode layer 116 from each other, and a mold insulating layer 121 electrically insulating the first pad electrode layer 118 and the second pad electrode layer 120 from each other.

The isolation insulating layer 112 may be formed of a silicon oxide layer or a silicon nitride layer. The mold insulating layer 121 may be formed of silicone resin, epoxy resin, or acrylic resin. A bottom surface of the mold insulating layer 121 may be coplanar with bottom surfaces of the pad electrode layers 118 and 120.

The other surfaces S2 of the light emitting structures 110, the top surfaces, for example, may have uneven structures 208 formed therein. A first protective layer 127 may be formed on the top surfaces of the light emitting structures 110 having the uneven structures 208. When the semiconductor light emitting device 100 is manufactured, the other surface S1 of the light emitting structure 110, which is a light emitting surface, may be protected by the first protective layer 127 such that light extraction efficiency may improve. Also, when the semiconductor light emitting device 100 is manufactured, the uneven structure 208 may not be damaged due to the first protective layer 127, and light extraction efficiency may thus improve. In the semiconductor light emitting device 100, the undamaged uneven structure 208 may be formed on the other surface S2 of the light emitting structure 110, which is a light emitting surface, for example, and light extraction efficiency may accordingly improve. Alternatively, in the example embodiment, the uneven structure 208 may not be formed on the top surfaces of the light emitting structures 110. The first protective layer 127 may be formed of a silicon oxide layer or a silicon nitride layer. A thickness of the first protective layer 127 covering the top surfaces of the light emitting structures 110 may be 100 nm or greater desirably.

A plurality of wavelength converting layers 128, 130 and 132 emitting lights having different colors may respectively be formed on the first protective layers 127 in the light emitting structures 110. The first wavelength converting layer 128 may emit blue light, the second wavelength converting layer 130 may emit green light, and the third wavelength converting layer 132 may emit red light. The plurality of wavelength converting layers 128, 130 and 132 may be formed of a resin layer containing a phosphor or a quantum dot (a nanophosphor). At least one of the plurality of wavelength converting layers 128, 130 and 132 may be formed of a transparent resin layer which does not include phosphor or a quantum dot, and may emit blue light from the light emitting structure 110. For example, the wavelength converting layers 128 may be formed of a transparent resin layer which does not include phosphor or a quantum dot. Wavelength filter layers and/or wavelength reflective layers may be formed on the plurality of wavelength converting layers 128, 130 and 132. The wavelength filter layers may pass certain wavelength ranges, such as red, green and blue spectral ranges, respectively, which pass through the wavelength converting layers 128, 130 and 132 and are emitted, and may improve color reproducibility of a display device. The wavelength reflective layers may reflect a light in a certain wavelength range which enters the plurality of wavelength converting layers 128, 130 and 132 from the outside. As the light emitting structures 110 are electrically isolated from one another and driven individually, the semiconductor light emitting device 100 may represent a variety of colors if desired.

A partition layer 124 may be disposed between the plurality of wavelength converting layers 128, 130 and 132 such that the plurality of wavelength converting layers 128, 130 and 132 may be isolated from one another. The partition layer 124 may provide a plurality of light emitting windows respectively corresponding to the plurality of light emitting structures 110, and may be integrally formed such that portions of the partition layer 124, respectively isolating the wavelength converting layers 128, 130 and 132 from one another, are connected to one another. The plurality of wavelength converting layers 128, 130 and 132 may respectively be disposed in the plurality of light emitting windows. The partition layer 124 may encapsulate the plurality of wavelength converting layers 128, 130 and 132 on a planar surface. The plurality of wavelength converting layers 128, 130 and 132 may be isolated from one another by the partition layer 124, and may respectively be disposed on the top surfaces of the light emitting structures 110. A height of the partition layer 124 may be within a range of 30 μm to 150 μm. A width of the partition layer 124 may be within a range of 10 μm to 30 μm.

The partition layer 124 may be disposed on the isolation layer 122 between the light emitting structures 110. The partition layer 124 may be in contact with the isolation layer 122. The partition layer 124 may be in contact with the isolation insulating layer 112.

The partition layer 124 may be formed of a semiconductor material, a metal material, or an insulating material. The semiconductor material may include silicon (Si), silicon carbide (SiC), and the like. The metal material may be aluminum (Al), gold (Au), silver (Ag), platinum (Pt), nickel (Ni), chromium (Cr), titanium (Ti), or copper (Cu), or alloys thereof. The metal material may be formed of a plating layer, for example. The insulating material may include $Al_2O_3$, $MgAl_2O_4$, MgO, $LiAlO_2$, $LiGaO_2$, resin (silicone, epoxy), and the like. The resin may include titanium oxide or other reflective materials therein. The resin may appear gray or black in color to absorb light from the outside. In the example embodiment, the partition layer 124 may be coated with a material appearing gray or black to absorb light from the outside. Accordingly, when a screen of a display device is turned off, an entire screen may appear black.

The semiconductor light emitting device 100 may include a reflective layer 404 disposed on side walls of the partition layer 124. The first protective layer 127 may extend into spaces between the side walls of the partition layers 124 and the reflective layers 404 from the top surfaces of the light emitting structures 110 and cover the side walls of the partition layers 124. The reflective layer 404 may cover the first protective layer 127 and may be disposed on the side walls of the partition layer 124. The first protective layer 127 may extend from the side walls of the partition layer 124 and cover a top surface of the partition layer 124. The first protective layer 127 may cover the top surface and the side walls of the partition layer 124, and may also cover the light emitting surfaces of the light emitting structures 110.

The reflective layer 404 may reflect light emitted from the light emitting structure 110. The reflective layer 404 may be a metal layer, a resin layer containing a metal oxide, or a distributed Bragg reflector layer. A thickness of the reflective layer 404 covering side walls of the light emitting structures 110 may be 100 nm or greater desirably. Specifically, a thickness of the reflective layer 404 covering the side walls of the light emitting structures 110 may be within a range of 100 nm to 500 nm.

The metal layer may be aluminum (Al), gold (Au), silver (Ag), platinum (Pt), nickel (Ni), chromium (Cr), titanium (Ti), or copper (Cu). The resin layer containing a metal oxide may be a resin layer containing titanium oxide. In the distributed Bragg reflector layer, a plurality of insulating layers having different refractive indexes may be alternately layered in several to hundreds layers, for example, in two to one hundred layers. The insulating layers forming the distributed Bragg reflector layer may be formed of oxide or nitride such as $SiO_2$, SiN, SiOxNy, $TiO_2$, $Si_3N_4$, $Al_2O_3$, TiN, AlN, $ZrO_2$, TiAlN, TiSiN, or compositions thereof. Accordingly, light extraction efficiency of the semiconductor light emitting device 100 may improve due to the reflective layer 404 disposed on the side walls of the partition layer 124.

The semiconductor light emitting device 100 may include a second protective layer 406 covering the reflective layer 404 disposed on the side walls of the partition layer 124. The second protective layer 406 may prevent damage to the reflective layer 404 or prevent by-products generated from etching from being formed on a surface of the reflective layer 404 during an etching process for forming the reflective layer 404 on the side walls of the partition layer 124, thereby preventing degradation of a reflectivity of the reflective layer 404. A thickness of the second protective layer 406 at the side walls of the partition layer 124 may be lower than a thickness of the first protective layer 127. The second protective layer 406 may be formed of a silicon oxide layer or a silicon nitride layer. A thickness of the second protective layer 406 covering the reflective layer 404 may preferably be 100 nm or greater. Specifically, a thickness of the second protective layer 406 covering the reflective layer 404 may be within a range of 100 nm to 500 nm.

For example, in the case in which the reflective layer 404 is formed of aluminum, the reflective layer 404 formed on the side walls of the partition layer 124 may be corroded by $Cl_2$ gas during an etching process. Also, a by-product generated from etching, such as aluminum chloride ($AlCl_3$), and the like, may be formed on a surface of the reflective layer 404 formed on the side walls of the partition layer 124. By forming the second protective layer 406 covering the reflective layer 404 before an etching process, corrosion of the reflective layer 404 or formation of by-products on a surface of the reflective layer 404 occurring during an etching process may be prevented.

A three-layer reflective structure including the first protective layer 127, the reflective layer 404, and the second protective layer 406, layered in order, may be disposed on side walls of the partition layer 124 of the semiconductor light emitting device 100. Accordingly, the semiconductor light emitting device 100 may represent multicolor while preventing optical interference between the light emitting cells A, B, and C and improving light extraction efficiency.

FIGS. 3 to 7 are schematic cross-sectional diagrams illustrating a semiconductor light emitting device according to example embodiments. FIGS. 3 to 7 illustrate regions corresponding to FIG. 2.

Figure 3:
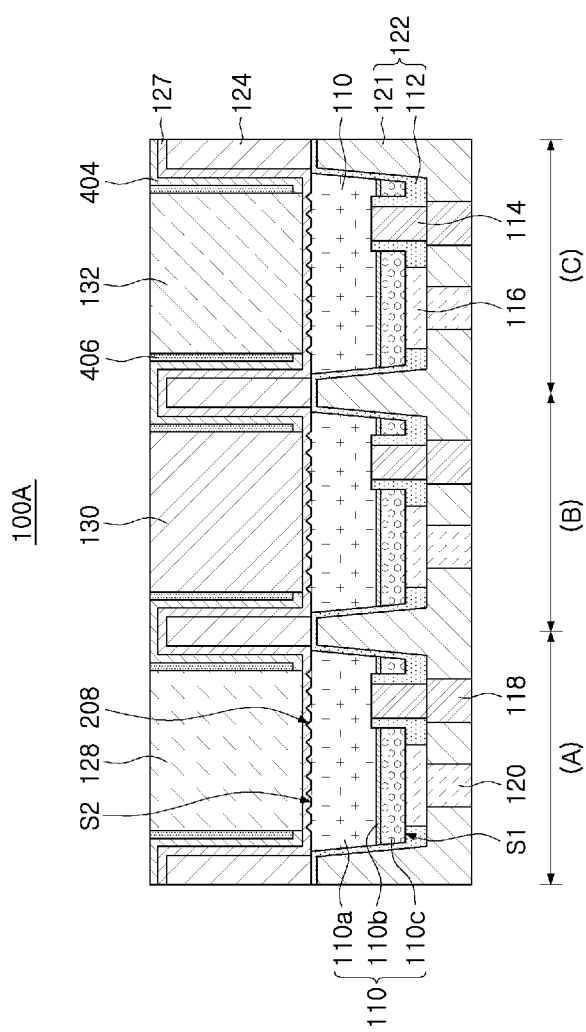
FIGS. 3 to 7 are schematic cross-sectional diagrams illustrating a semiconductor light emitting device according to example embodiments.

Referring to FIG. 3, in a semiconductor light emitting device 100A, a reflective layer 404 may cover a first protective layer 127 on a top surface of a partition layer 124 differently from the semiconductor light emitting device 100 in FIG. 2. Apart from the difference described above, the configuration of the semiconductor light emitting device 100A may be the same as the configuration of the semiconductor light emitting device 100 in FIG. 2.

Figure 4:
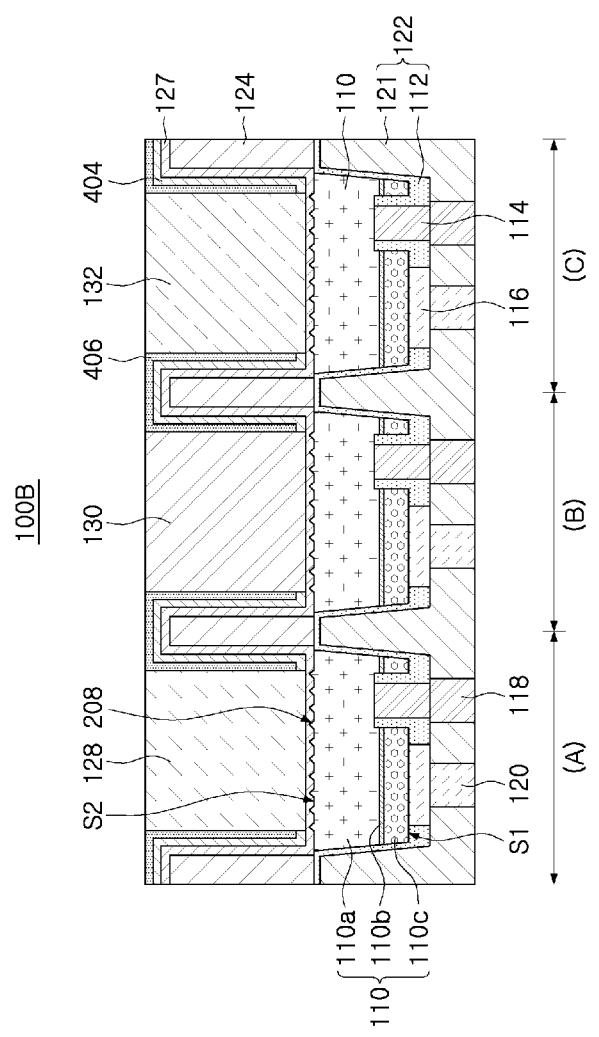

Referring to FIG. 4, in a semiconductor light emitting device 100B, a reflective layer 404 may cover a first protective layer 127 on a top surface of a partition layer 124, and a second protective layer 406 may cover the reflective layer 404 on a top surface of the partition layer 124, differently from the semiconductor light emitting device 100 in FIG. 2. Apart from the differences described above, the configuration of the semiconductor light emitting device 100B may be the same as the configuration of the semiconductor light emitting device 100 in FIG. 2.

Figure 5:
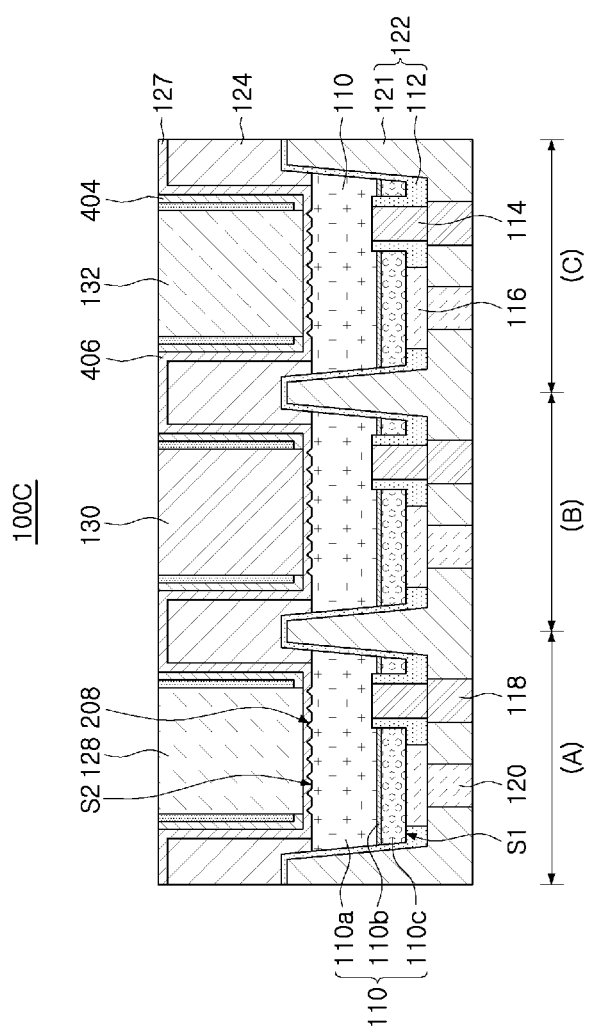

Referring to FIG. 5, in a semiconductor light emitting device 100C, an isolation layer 122 may be inserted into a lower portion of a partition layer 124 differently from the semiconductor light emitting device 100 in FIG. 2. Apart from the difference described above, the configuration of the semiconductor light emitting device 100C may be the same as the configuration of the semiconductor light emitting device 100 in FIG. 2.

Figure 6:
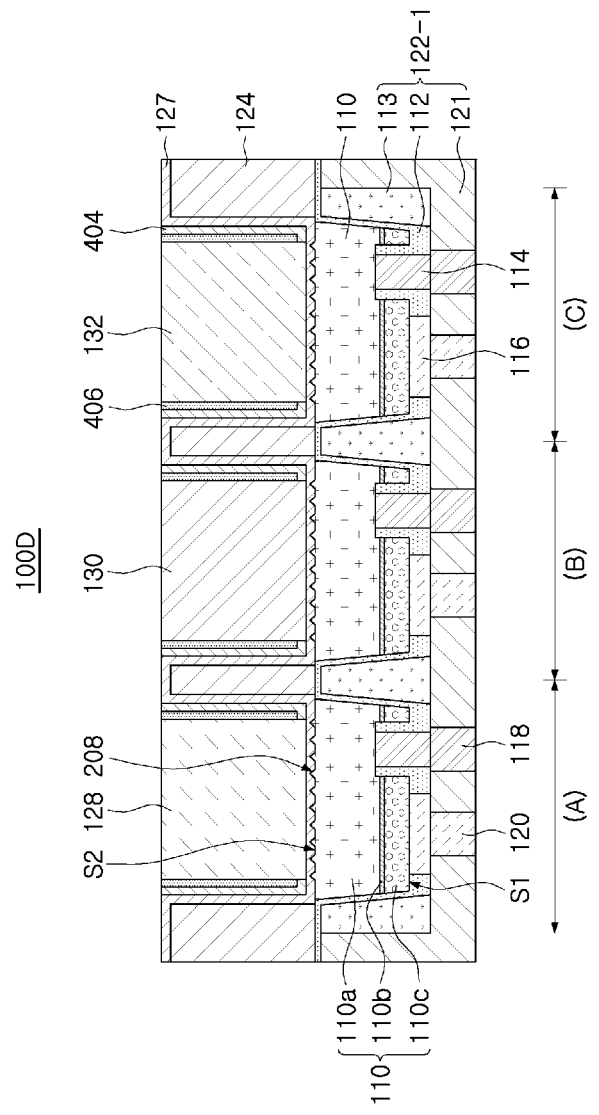

Referring to FIG. 6, a semiconductor light emitting device 100D may include an isolation layer 122-1 electrically insulating light emitting structures 110 from one another differently from the semiconductor light emitting device 100 in FIG. 2.

The isolation layer 122-1 may include an isolation insulating layer 112 covering side surfaces and bottom surfaces of the light emitting structures 110 and electrically insulating reflective electrode layers 114 and 116 from each other, a metal layer 113 covering side surfaces of the light emitting structures 110 and electrically insulated from the light emitting structures 110 by the isolation insulating layer 112, and a mold insulating layer 121 covering the isolation insulating layer 112 and the metal layer 113 and electrically insulating pad electrode layers 118 and 120 from each other. Apart from the differences described above, the configuration of the semiconductor light emitting device 100D may be the same as the configuration of the semiconductor light emitting device 100 in FIG. 2.

Figure 7:
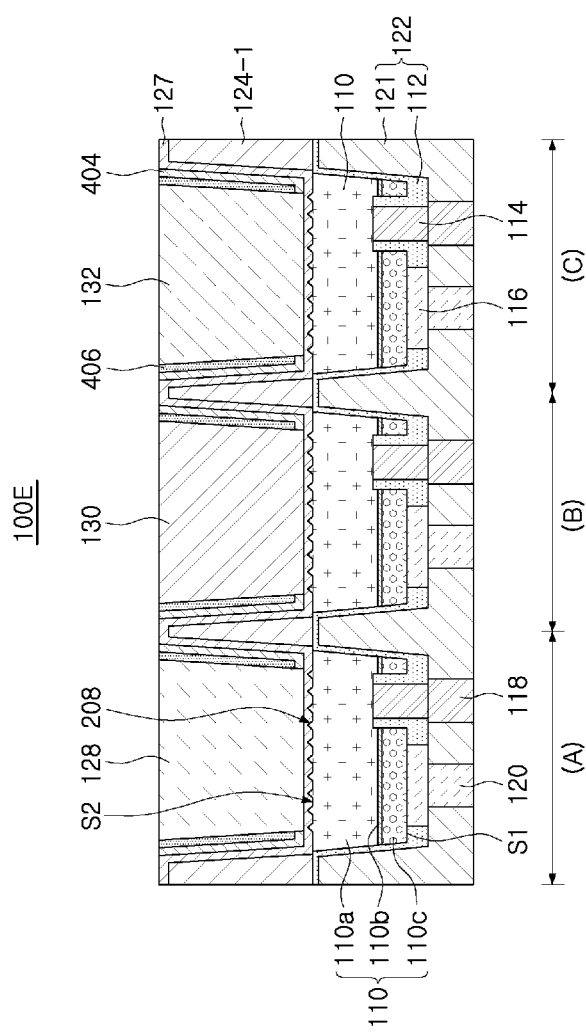

Referring to FIG. 7, in a semiconductor light emitting device 100E, side walls of a partition layer 124-1 may have slopes such that a width of the partition layer 124-1 decreases upwardly. A width of an upper portion of the partition layer 124-1 may be smaller than a width of a lower portion of the partition layer 124-1. By including the partition layer 124-1 having the sloped side walls, light extraction efficiency of the semiconductor light emitting device 100E may improve.

Figure 8:
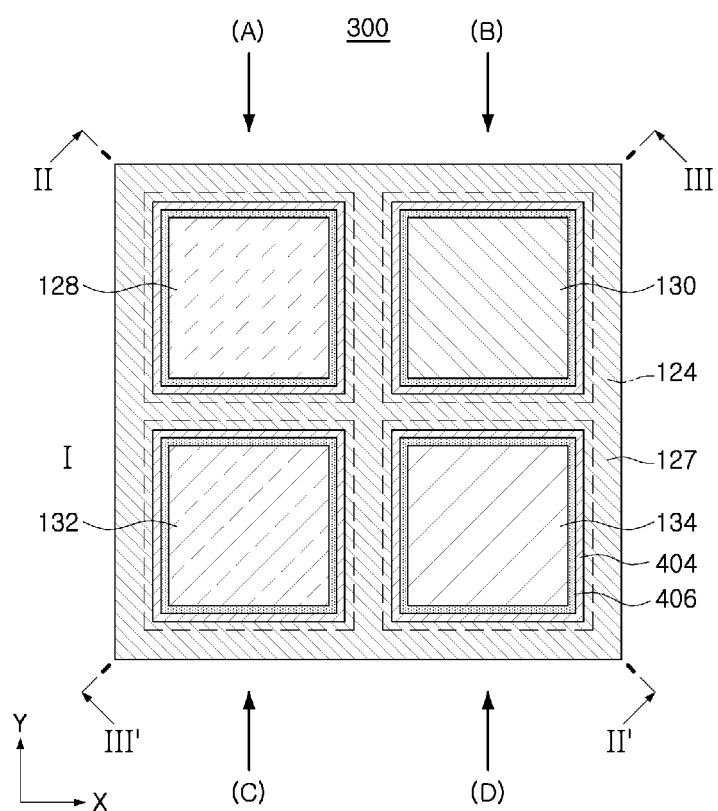
FIG. 8 is a plan view illustrating a semiconductor light emitting device according to an example embodiment.
Figure 9:
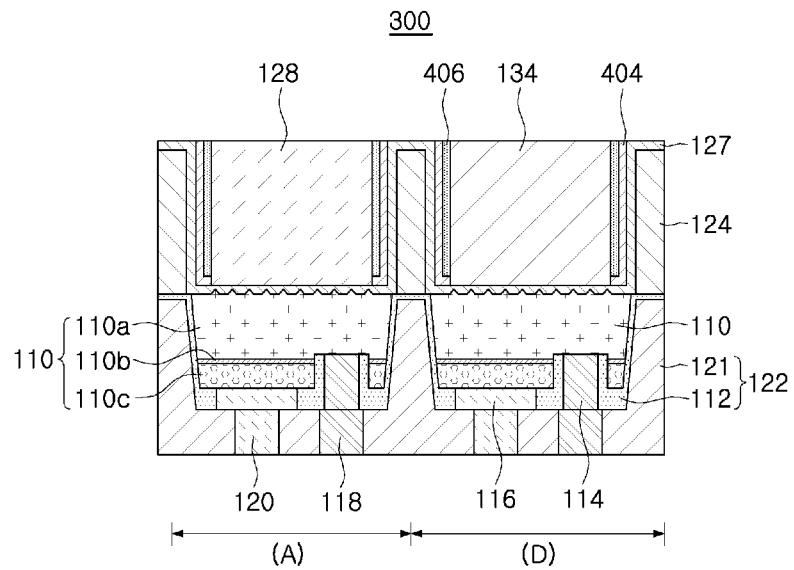
FIGS. 9 and 10 are cross-sectional diagrams taken along lines II-II' and in FIG. 8, respectively.
Figure 10:
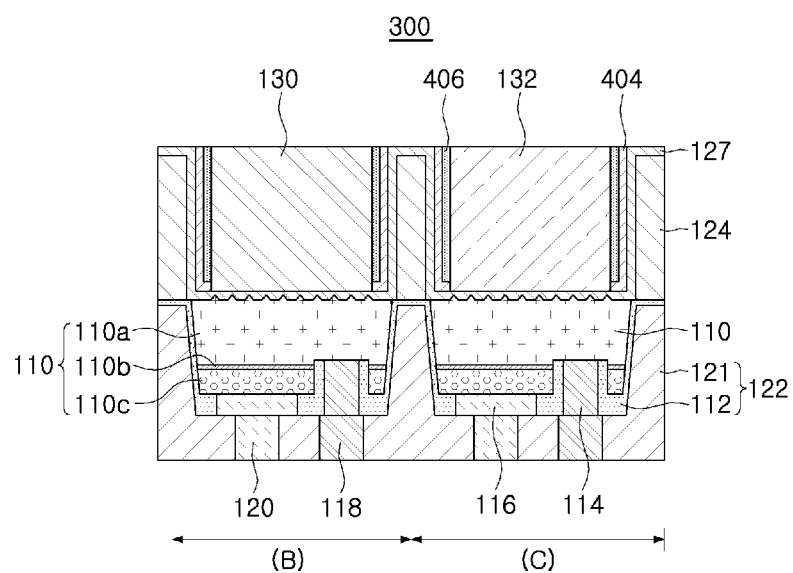

FIG. 8 is a plan view illustrating a semiconductor light emitting device 300 according to an example embodiment. FIGS. 9 and 10 are cross-sectional diagrams taken along lines II-II' and III-III' in FIG. 8, respectively. Apart from the configuration in which the semiconductor light emitting device 300 in FIGS. 8 to 10 includes four light emitting cells A, B, C, and D, the configuration of the semiconductor light emitting device 300 in FIGS. 8 to 10 may be the same as the configuration of the semiconductor light emitting device 100 in FIGS. 1 and 2. FIG. 9 illustrates the first light emitting cell A and the fourth light emitting cell D, and FIG. 10 illustrates the second light emitting cell B and the fourth light emitting cell C.

The semiconductor light emitting device 300 may include the four light emitting cells A, B, C, and D, which are the first light emitting cell A, the second light emitting cell B, a third light emitting cell C, and the fourth light emitting cell D. The first light emitting cell A and the second light emitting cell B may be spaced apart from each other in an X direction, and the third light emitting cell C and the fourth light emitting cell D may also be spaced apart from each other in the X direction. The third light emitting cell C may be spaced apart from the first light emitting cell A in a Y direction, and the fourth light emitting cell D may be spaced apart from the second light emitting cell B in the Y direction. The arrangement of the first light emitting cell A, the second light emitting cell B, the third light emitting cell C, and the fourth light emitting cell D may vary if desired.

In FIG. 8, the light emitting cells A, B, C, and D may be isolated from one another by a partition layer 124 extending in both of the X direction and the Y direction. The partition layer 124 may encapsulate wavelength converting layers 128, 130, 132, and 134.

In the semiconductor light emitting device 300, each of the light emitting cells A, B, C, and D may include a light emitting structure 110. The light emitting cells A, B, C, and D may include the light emitting structures 110 emitting a light having an ultraviolet wavelength or a blue wavelength. The light emitting structure 110 may include a first conductivity-type semiconductor layer 110a, an active layer 110b, and a second conductivity-type semiconductor layer 110c.

Pad electrode layers 118 and 120 may be formed on one surfaces of the light emitting structures 110, which are bottom surfaces of the light emitting structure 110, for example. Accordingly, the semiconductor light emitting device 300 may have a flip ship structure and be mounted on a board substrate (not illustrated).

A first reflective electrode layer 114 and a second reflective electrode layer 116 may be disposed on the first pad electrode layer 118 and the second pad electrode layer 120. The first reflective electrode layer 114 and the second reflective electrode layer 116 may be electrically connected to the first conductivity-type semiconductor layer 110a and the second conductivity-type semiconductor layer 110c, respectively.

In the semiconductor light emitting device 300, an isolation layer 122 may be formed between the light emitting structures 110 to insulate the light emitting structures 110 from one another, and may be formed between the reflective electrode layers 114 and 116 and between the pad electrode layers 118 and 120 to insulate the reflective electrode layers 114 and 116 from each other and the pad electrode layers 118 and 120 from each other. The isolation layer 122 may include an isolation insulating layer 112 covering side surfaces and bottom surfaces of the light emitting structures 110 and electrically insulating the reflective electrode layers 114 and 116 from each other, and a mold insulating layer 121 covering the isolation insulating layer 112 and electrically insulating the pad electrode layers 118 and 120 from each other. In the semiconductor light emitting device 300, the light emitting structures 110 may be electrically isolated from one another and driven individually by means of the isolation layer 122. By the isolation layer 122, the light emitting structures 110 may be divided into a first light emitting cell A, a second light emitting cell B, a third light emitting cell C, and a fourth light emitting cell D, for example.

In the semiconductor light emitting device 300, a plurality of wavelength converting layers 128, 130, 132, and 134 emitting lights having different colors may respectively be formed on the other surfaces S2 of the light emitting structures 110, which is top surfaces of the light emitting structures 110, for example. The plurality of wavelength converting layers 128, 130, 132, and 134 may be isolated from one another by the partition layer 124 and may be disposed on the top surfaces of the light emitting structures 110, respectively. The first wavelength converting layer 128 may emit blue light, the second wavelength converting layer 130 may emit green light, the third wavelength converting layer 132 may emit red light, and the fourth wavelength converting layer 134 may emit white light. The plurality of wavelength converting layers 128, 130, 132, and 134 may be formed of resin layers containing phosphor or a quantum dot (a nanophosphor). The light emitting structures 110 may be electrically isolated from one another and driven individually, and accordingly, the semiconductor light emitting device 300 may represent a variety of colors if desired.

A three-layer reflective structure including the first protective layer 127, the reflective layer 404, and the second protective layer 406, layered in order, may be disposed on side walls of the partition layer 124 of the semiconductor light emitting device 300.

Accordingly, the semiconductor light emitting device 300 may represent multicolor while preventing optical interference among the light emitting cells A, B, C, and D and improving light extraction efficiency.

FIGS. 11 to 17 are cross-sectional diagrams illustrating a method of manufacturing a semiconductor light emitting device according to an example embodiment.

Figure 11:
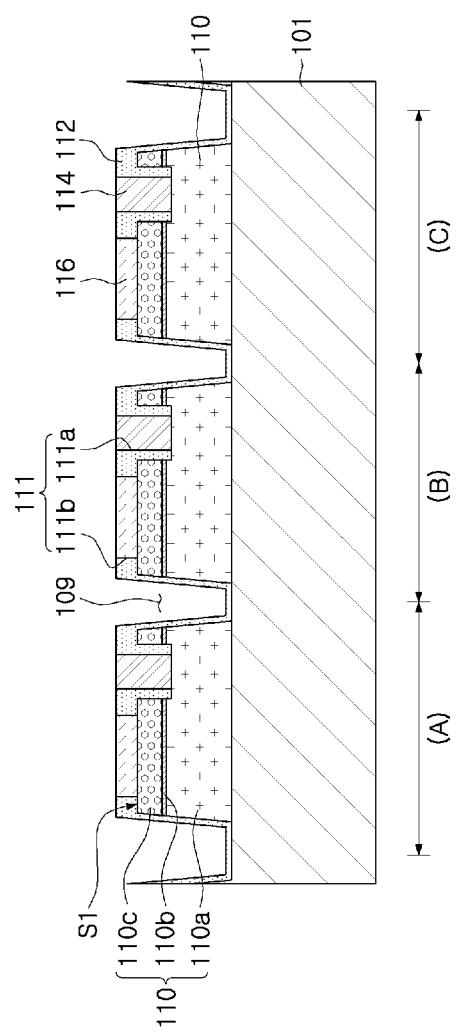
FIGS. 11 to 17 are cross-sectional diagrams illustrating a method of manufacturing a semiconductor light emitting device according to an example embodiment.

Referring to FIG. 11, a light emitting structure 110 including a first conductivity-type semiconductor layer 110a, an active layer 110b, and a second conductivity-type semiconductor layer 110c may be formed on a substrate 101. An isolation groove 109 isolating light emitting cells A, B, and C from one another may be formed by etching a partial region of the light emitting structure 110. In other words, the isolation groove 109 dividing the light emitting structures 110 into the first light emitting cell A, the second light emitting cell B, and the third light emitting cell C may be formed.

An isolation insulating layer 112 having exposure holes 111 which expose a portion of the light emitting structure 110 may be formed on inner walls of the isolation groove 109 and on the light emitting structure 110. The exposure holes 111 may include a first sub-exposure hole 111a and a second sub-exposure hole 111b. The isolation insulating layer 112 may be formed of a silicon oxide layer or a silicon nitride layer. The isolation insulating layer 112 may be formed on side walls and one surface S1 of the light emitting structure 110. The first sub-exposure hole 111a may expose the first conductivity-type semiconductor layer 110a, such as an N-type semiconductor layer, for example. The second sub-exposure hole 111b may expose the second conductivity-type semiconductor layer 110c, such as a P-type semiconductor layer, for example.

Reflective electrode layers 114 and 116 may be formed in the exposure holes 111. The first reflective electrode layer 114 and the second reflective electrode layer 116 may be formed in the first sub-exposure hole 111a and the second sub-exposure hole 111b, respectively. The reflective electrode layers 114 and 116 may be formed of a material having a high reflectivity, such as a metal layer, for example. The reflective electrode layers 114 and 116 may be formed of aluminum (Al), gold (Au), silver (Ag), platinum (Pt), nickel (Ni), chromium (Cr), titanium (Ti), or copper (Cu). The reflective electrode layers 114 and 116 may reflect light emitted from the light emitting structure 110 and may serve as an electrode layer. The reflective electrode layers 114 and 116 may respectively be formed on the one surfaces S1 of the light emitting structures 110.

Figure 12:
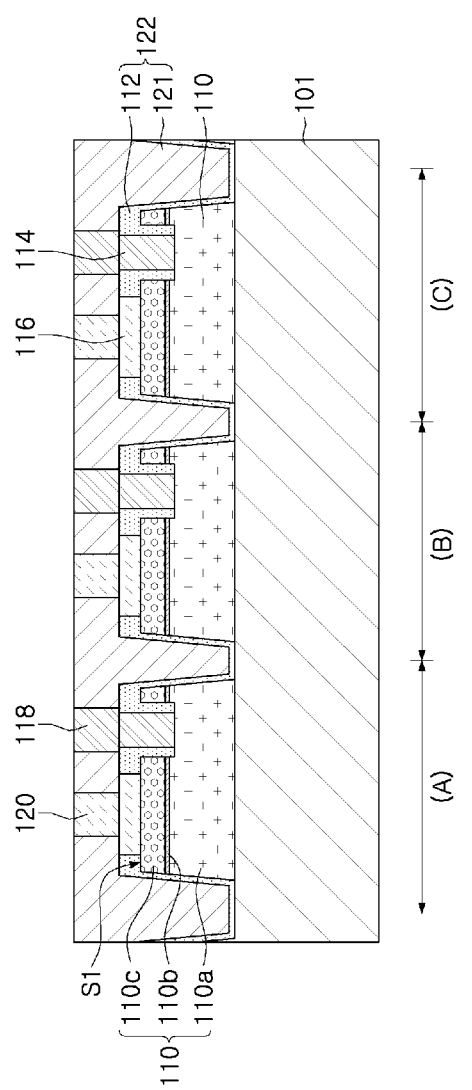

Referring to FIG. 12, pad electrode layers 118 and 120 may be formed on the reflective electrode layers 114 and 116. In other words, the first pad electrode layer 118 and the second pad electrode layer 120 may be formed on the first reflective electrode layer 114 and the second reflective electrode layer 116, respectively. The first pad electrode layer 118 may be electrically connected to the first conductivity-type semiconductor layer 110a, and the second pad electrode layer 120 may be electrically connected to the second conductivity-type semiconductor layer 110c. The first pad electrode layer 118 and the second pad electrode layer 120 may be formed of the same material as the material of the first reflective electrode layer 114 and the second reflective electrode layer 116. Through the processes described above, the pad electrode layers 118 and 120 and the reflective electrode layers 114 and 116 may be formed on each of the one surfaces S1 of the light emitting structures 110.

Thereafter, a mold insulating layer 121 electrically insulating the pad electrode layers 118 and 120 from each other and electrically insulating the light emitting structures 110 from one another may be formed. The mold insulating layer 121 may be integrally formed such that portions of the mold insulating layer 121, respectively insulating the light emitting structures 110 from one another, are connected to one another. The mold insulating layer 121 may be formed of silicone resin, epoxy resin, or acrylic resin. A surface of the mold insulating layer 121 may be coplanar with surfaces of the pad electrode layers 118 and 120. Through the processes described above, the isolation insulating layer 112 and the mold insulating layer 121 may form the isolation layer 122 electrically isolating the light emitting cells A, B, and C from one another.

Figure 13:
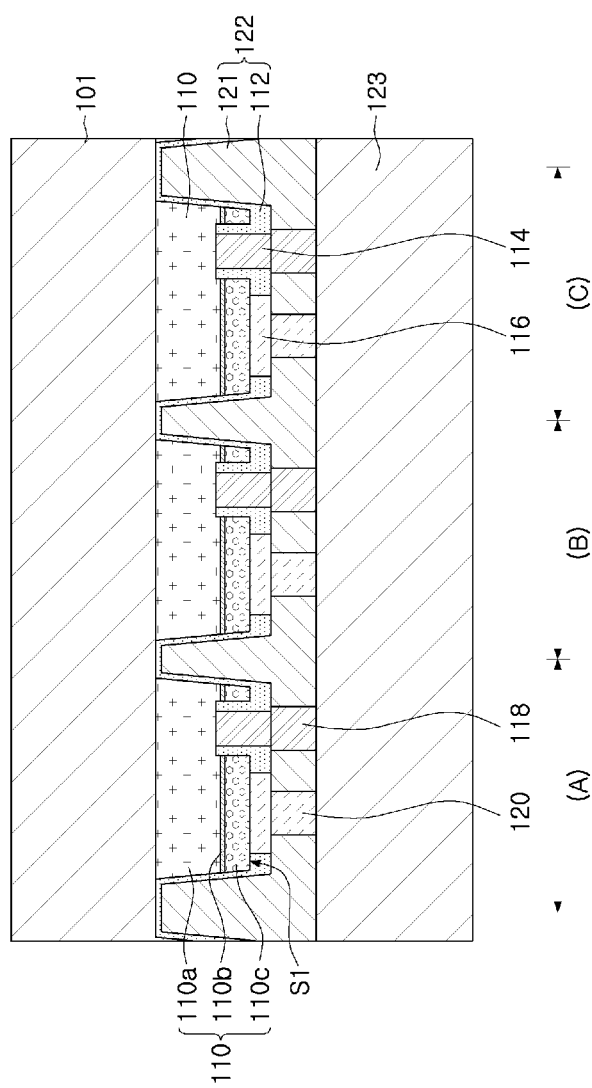

Referring to FIG. 13, a temporary substrate 123 may be attached to the pad electrode layers 118 and 120 and the isolation layer 122. The temporary substrate 123 may support the pad electrode layers 118 and 120 and the isolation layer 122. The temporary substrate 123 may be a glass substrate, an insulating substrate, or the like.

The temporary substrate 123 may face downwardly, and the substrate 101 may be ground to reduce a thickness of the substrate 101.

Figure 14:
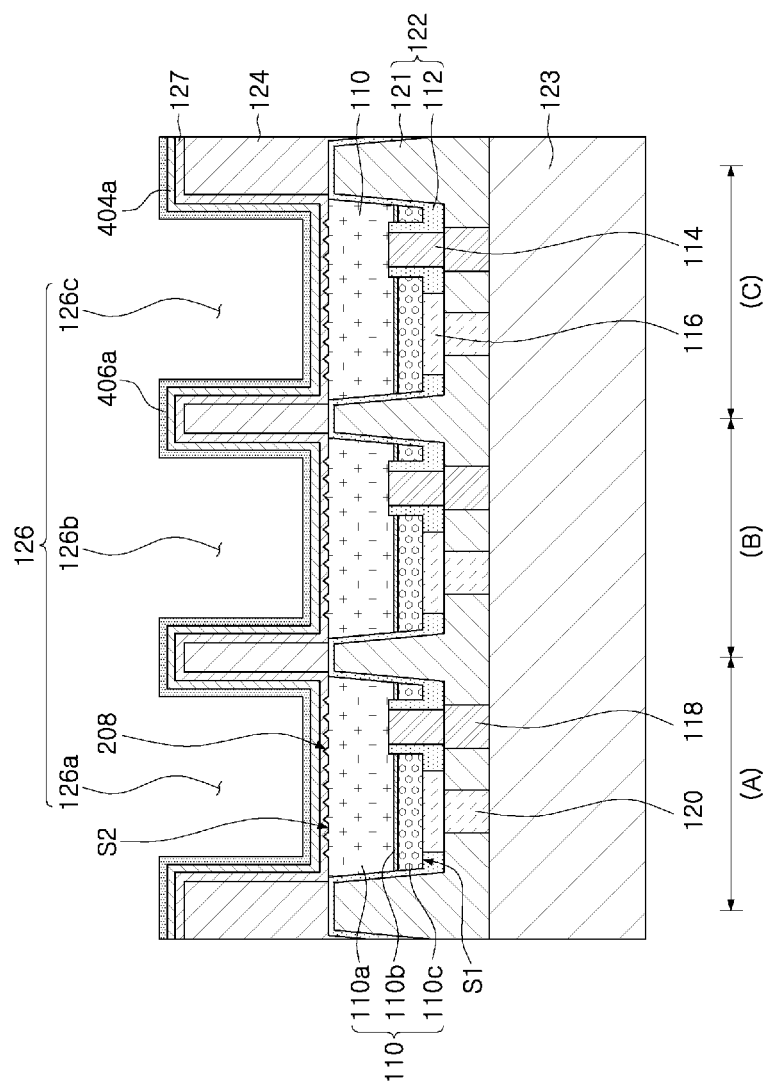

Referring to FIG. 14, a partition layer 124 having exposure holes 126 which expose the other surfaces S2 of light emitting structures 110 may be formed by etching a partial region of the substrate 101. The exposure holes 126 may include a first sub-exposure hole 126a, a second sub-exposure hole 126b, and a third sub-exposure hole 126c respectively formed in the light emitting cells A, B, and C. The first sub-exposure hole 126a, the second sub-exposure hole 126b, and the third sub-exposure hole 126c may be a first light emitting window, a second light emitting window, and a third light emitting window, respectively. The partition layer 124 may be integrally formed. The partition layer 124 may be formed of a semiconductor material or an insulating material depending on the substrate 101.

As the partition layer 124 in the example embodiment is formed of a portion of the substrate 101, an additional formation process may not be necessary. Thus, a manufacturing process may be simplified, and a height of the partition layer 124 may be easily adjusted.

An uneven structure 208 may be formed on the other surfaces S2 of the light emitting structures 110 exposed through the exposure holes 126. In the example embodiment, the uneven structure 208 may not be formed if desired.

A first protective layer 127 may be formed on the other surfaces S2 of the light emitting structures 110 and a top surface and side surfaces of the partition layer 124. The first protective layer 127 may be formed to protect the other surfaces S2 of the light emitting structures 110, which are light emitting surfaces, during a subsequent process. Thereafter, a light reflecting material layer 404a may be formed on the first protective layer 127. The light reflecting material layer 404a may be formed of the same material as the material of the reflective layer 404 described above. A second protective material layer 406a may be formed on the light reflecting material layer 404a. The second protective material layer 406a may be formed of the same material as the material of the second protective layer 406 described above.

Figure 15:
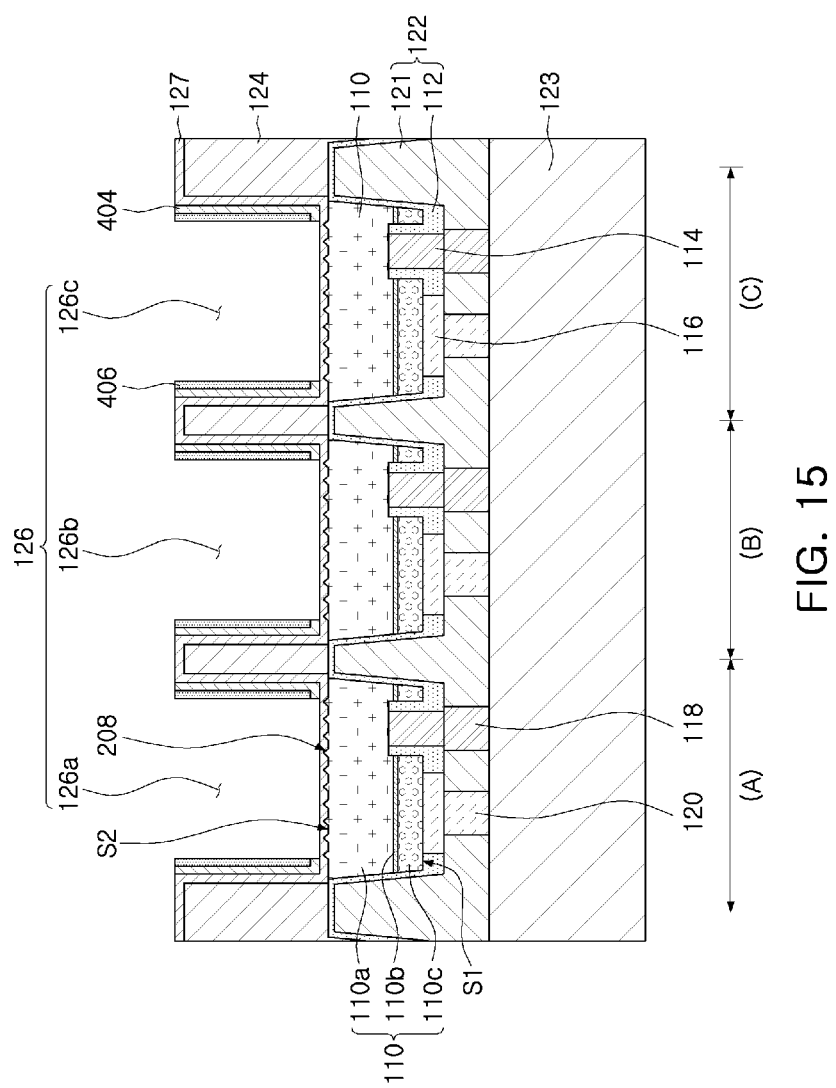

Referring to FIG. 15, a reflective layer 404 and a second protective layer 406 may be formed by etching a light reflecting material layer 404a and a second protective material layer 406a. When the light reflecting material layer 404a and the second protective material layer 406a are etched, the light reflecting material layer 404a and the second protective material layer 406a formed on the other surface S2 of the light emitting structure 110 and on the top surface of the partition layer 124 may be removed. The reflective layer 404 and the second protective layer 406 may be formed on side walls of the partition layer 124. Through the processes described above, the first protective layer 127, the reflective layer 404, and the second protective layer 406, layered in order, may be formed on the side walls of the partition layer 124.

In the example embodiment, when the light reflecting material layer 404a and the second protective material layer 406a are etched, the second protective material layer 406a and the light reflecting material layer 404a formed on the other surface S2 of the light emitting structure 110 may be removed, and the second protective material layer 406a formed on the top surface of the partition layer 124 may be removed. The light reflecting material layer 404a formed on the top surface of the partition layer 124 may remain. The reflective layer 404 may be formed on the top surface and side walls of the partition layer 124, and the second protective layer 406 may be formed on the side walls of the partition layer 124. Through the processes described above, the first protective layer 127, the reflective layer 404, and the second protective layer 406, layered in order, may be formed on the side walls of the partition layer 124, and the first protective layer 127 and the reflective layer 404 may be formed on the top surface of the partition layer 124.

In the example embodiment, when the light reflecting material layer 404a and the second protective material layer 406a are etched, the second protective material layer 406a and the light reflecting material layer 404a formed on the other surface S2 of the light emitting structure 110 may be removed, and the second protective material layer 406a and the light reflecting material layer 404a formed on the top surface of the partition layer 124 may remain. The reflective layer 404 and the second protective layer 406 may be formed on the top surface and the side walls of the partition layer 124. Through the processes described above, the first protective layer 127, the reflective layer 404, and the second protective layer 406, layered in order, may be formed on the side walls and the top surface of the partition layer 124.

Figure 16:
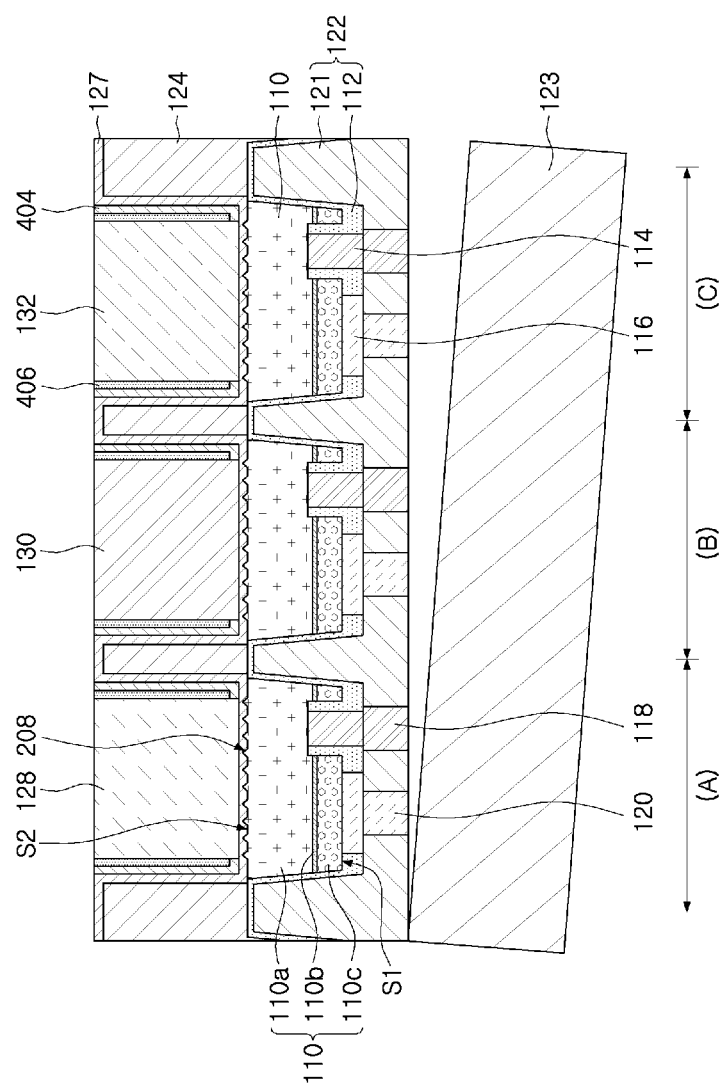

Referring to FIG. 16, wavelength converting layers 128, 130 and 132 may respectively be formed on first protective layers 127 in exposure holes 126 on light emitting structures 110. The first wavelength converting layer 128, the second wavelength converting layer 130, and the third wavelength converting layer 132 may be formed in a first sub-exposure hole 126a, a second sub-exposure hole 126b, and a third sub-exposure hole 126c, respectively. A temporary substrate 123 may be removed thereafter.

Figure 17:
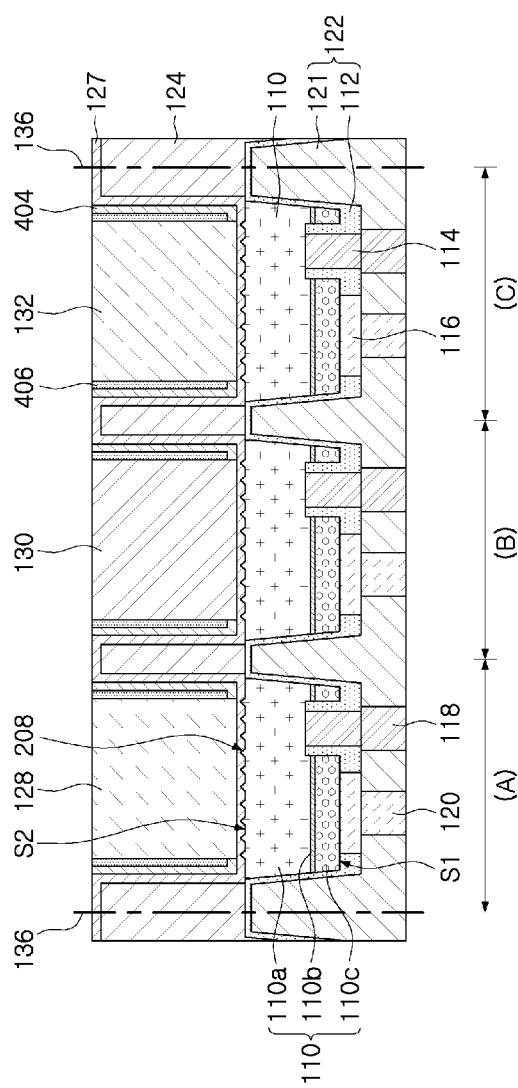

Referring to FIG. 17, a first protective layer 127, a partition layer 124, and an isolation layer 122 may be cut along a cutout line 136 to include a plurality of light emitting cells A, B, and C, and a semiconductor light emitting device 100 may be manufactured.

According to the aforementioned example embodiments, by including the isolation layer isolating the plurality of light emitting cells from one another, which are driven individually, and the partition layer disposed on the isolation layer, and forming the first protective layer, the reflective layer, and the second protective layer in order on side walls of the partition layer in the semiconductor light emitting device, the semiconductor light emitting device may represent multicolor, optical interference among the plurality of light emitting cells may be prevented, and light extraction efficiency may improve.

While the example embodiments have been shown and described above, it will be apparent to those skilled in the art that modifications and variations could be made without departing from the scope of the inventive concept as defined by the appended claims.

What is claimed is:

1. A semiconductor light emitting device, comprising:
   a plurality of light emitting structures;
   an isolation layer covering side surfaces of the plurality of light emitting structures and insulating the plurality of light emitting structures from one another;
   a partition layer formed on the isolation layer;
   a first protective layer covering top surfaces of the plurality of light emitting structures and side walls of the partition layer;
   a reflective layer covering the first protective layer and disposed on the side walls of the partition layer; and
   a second protective layer covering the reflective layer.

2. The semiconductor light emitting device of claim 1, wherein the first protective layer covers a top surface of the partition layer.

3. The semiconductor light emitting device of claim 2, wherein the reflective layer covers the first protective layer on the top surface of the partition layer.

4. The semiconductor light emitting device of claim 3, wherein the second protective layer covers the reflective layer on the top surface of the partition layer.

5. The semiconductor light emitting device of claim 1, further comprising a plurality of wavelength converting layers isolated from one another by the partition layer, respectively disposed on the top surfaces of the plurality of light emitting structures, and emitting lights having different colors.

6. The semiconductor light emitting device of claim 5, wherein the partition layer is integrally formed such that portions of the partition layer, respectively isolating the wavelength converting layers from one another, are connected to one another.

7. The semiconductor light emitting device of claim 1, wherein the partition layer is formed of a semiconductor material or an insulating material.

8. The semiconductor light emitting device of claim 1, wherein the top surfaces of the plurality of light emitting structures have uneven structures, and the first protective layer covers each of the uneven structures.

9. The semiconductor light emitting device of claim 1, wherein the isolation layer is integrally formed such that portions of the isolation layer, respectively insulating the plurality of light emitting structures from one another, are connected to one another.

10. The semiconductor light emitting device of claim 1, wherein the isolation layer comprises:
    an isolation insulating layer covering side surfaces and bottom surfaces of the plurality of light emitting structures; and
    a mold insulating layer covering the isolation insulating layer, and
    wherein a portion of the isolation insulating layer is in contact with the partition layer.

11. The semiconductor light emitting device of claim 1, wherein the isolation layer comprises:
    an isolation insulating layer covering side surfaces and bottom surfaces of the plurality of light emitting structures;
    a metal layer covering side surfaces of the plurality of light emitting structures and electrically insulated from the plurality of light emitting structures by the isolation insulating layer; and
    a mold insulating layer covering the isolation insulating layer and the metal layer.

12. The semiconductor light emitting device of claim 1, wherein the side walls of the partition layer has a slope such that a width of the partition layer decreases upwardly.

13. The semiconductor light emitting device of claim 1, wherein the isolation layer is inserted into a lower portion of the partition layer.

14. The semiconductor light emitting device of claim 1, wherein the reflective layer is formed of a metal material, a resin layer containing a metal oxide, or a distributed Bragg reflector layer.

15. A semiconductor light emitting device, comprising:
    a plurality of light emitting structures;
    an isolation layer insulating the plurality of light emitting structures from one another;
    a partition layer formed on the isolation layer and providing a plurality of light emitting windows respectively corresponding to the plurality of light emitting structures; and
    a three-layer reflective structure covering side walls of the partition layer.

16. The semiconductor light emitting device of claim 15, wherein the reflective structure comprises:
    a first protective layer covering side walls of the partition layer;
    a reflective layer covering the first protective layer and disposed on the side walls of the partition layer; and
    a second protective layer covering the reflective layer.

17. The semiconductor light emitting device of claim 16, further comprising a plurality of wavelength converting layers respectively disposed in the plurality of light emitting windows, and emitting lights having different colors,
    wherein the partition layer is integrally formed such that portions of the partition layer, respectively isolating the wavelength converting layers from one another, are connected to one another, and
    wherein the isolation layer is integrally formed such that portions of the isolation layer, respectively insulating the plurality of light emitting structures from one another, are connected to one another.

18. The semiconductor light emitting device of claim 17, wherein the first protective layer extends into spaces between the plurality of light emitting structures and the plurality of wavelength converting layers and covers the plurality of light emitting structures.

19. A semiconductor light emitting device, comprising:
    a plurality of light emitting structures;
    a plurality of wavelength converting layers disposed on the plurality of light emitting structures;
    a partition layer encapsulating the plurality of wavelength converting layers and isolating the plurality of wavelength converting layers from one another; and
    a reflective structure disposed between the plurality of wavelength converting layers and the partition layer, and comprising a first insulating layer, a reflective layer, and a second insulating layer layered therein.

20. The semiconductor light emitting device of claim 19, wherein the first insulating layer covers a top surface of the partition layer, and the reflective layer covers the first insulating layer on the top surface of the partition layer.

* * * * *